(12) United States Patent
Stacey

(10) Patent No.: US 8,183,143 B2
(45) Date of Patent: May 22, 2012

(54) FORMATION OF SOLDER BUMPS

(75) Inventor: Simon Jonathan Stacey, Ipswich (GB)

(73) Assignee: Cambridge Silicon Radio Limited, Cambridge (GB)

( * ) Notice: Subject to any disclaimer, the term of this patent is extended or adjusted under 35 U.S.C. 154(b) by 112 days.

(21) Appl. No.: 12/675,253

(22) PCT Filed: Aug. 7, 2008

(86) PCT No.: PCT/EP2008/060418
§ 371 (c)(1),
(2), (4) Date: Feb. 25, 2010

(87) PCT Pub. No.: WO2009/027198
PCT Pub. Date: Mar. 5, 2009

(65) Prior Publication Data
US 2010/0210101 A1  Aug. 19, 2010

(30) Foreign Application Priority Data
Aug. 29, 2007  (GB) .................................. 0716716.6

(51) Int. Cl.
*H01L 21/44*  (2006.01)

(52) U.S. Cl. .................. 438/613; 257/E21.508

(58) Field of Classification Search .................. 438/612, 438/613; 257/508
See application file for complete search history.

(56) References Cited

U.S. PATENT DOCUMENTS

| 5,307,983 | A | | 5/1994 | Dudderar et al. |
| 5,762,259 | A | * | 6/1998 | Hubacher et al. ........ 228/180.22 |
| 7,012,334 | B2 | * | 3/2006 | Liu et al. ...................... 257/737 |
| 2002/0036344 | A1 | | 3/2002 | Tatsumi et al. |
| 2006/0086777 | A1 | | 4/2006 | Itoh et al. |

OTHER PUBLICATIONS

International Preliminary Report on Patentability, WIPO, Mar. 2, 2010.
Comments of Applicant submitted to WIPO, Feb. 20, 2009.

* cited by examiner

*Primary Examiner* — Quoc Hoang
(74) *Attorney, Agent, or Firm* — Novak Druce DeLuca + Quigg LLP

(57) ABSTRACT

A method of providing connections to a chip having contact pads on the surface thereof, comprising: locating a discrete solder element on each pad; and melting the discrete solder elements so as to cause each of them to adhere to the respective pad, thereby forming a solder bump extending from the surface of the chip; wherein the size of each discrete solder element relative to the area of the pad on which it is located is such that the height of each bump is less than 70% of the diameter of the solder element that formed it.

20 Claims, 1 Drawing Sheet

FORMATION OF SOLDER BUMPS

The present invention relates to a technique for electrically connecting a printed circuit board to a chip defining one or more electronic devices.

One known technique of connecting a printed circuit board to a chip is known as wafer-level chip scale packaging (WLCSP), in which the "package" or interconnect elements are fabricated on the wafer prior to singulation. This technique is characterised in that: (a) there is no pre-assembly of the chip on a substrate before mounting onto the printed circuit board; and (b) the chip is ready for surface mounting on a printed circuit board as soon as it is singulated from the wafer. The area the thus packaged chip occupies when mounted onto a printed circuit board is the size of the silicon die.

Figure 1:
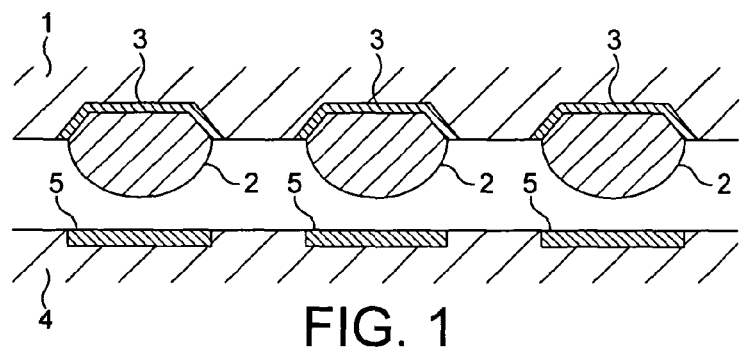

In WLCSP and other processes, solder bumps can be used to make the electrical connections between a chip and a circuit board. The process of making such connections is shown in FIG. 1. Prior to the making of the connection, as shown in FIG. 1, the chip 1 has solder bumps 2 attached to contact pads or lands 3 on its surface. The chip with the attached bumps is positioned on a circuit board 4 with the solder bumps 2 in contact with corresponding pads 5 on the surface of the circuit board. The solder bumps are then melted to cause them to adhere to the pads 5, making connections between the respective pairs of pads 3 and 5.

The solder bumps can be formed in a number of ways. One method is electroplating, in which the solder bumps are progressively deposited from an electrolyte on to the lands. Another method is printing. A third method uses pre-formed solder balls. In the third method pre-formed solder balls of approximately the same diameter as the lands are positioned over the lands and are melted so as to cause them to adhere to the lands. For example, melting solder balls of diameter 300 µm on to lands of 300 µm diameter results in bumps of height around 240 µm. Melting solder balls of diameter 250 µm on to lands of 250 µm diameter results in bumps of height around 200 µm.

Each of these processes suffers from problems. The plating and printing processes place limitations on the choice of compositions that can be used for the solder. The lead free compositions conventionally used for improved reliability utilise ternary and quaternary compositions. These compositions are inherently difficult, if not impossible, to control in an electroplating process. From the manufacturer's standpoint the electroplating process is also inflexible because in order to change solder composition for a particular batch of chips the entire electrolyte must be changed and the process re-established. Additionally, electroplating and printing processes tend to suffer from solder voids and inclusions due to poor cleanliness. These degrade the reliability of the final joint.

The solder ball process suffers from the disadvantage that it results in a relatively large stand-off height: i.e. the final spacing between the chip and the circuit board. Plating and printing can provide smaller stand-off heights but when the stand-off height is small the bumps 2 need to be of very high precision in order to ensure that good contact is made at all the junctions. If the bumps are not of precisely uniform size and the chip and the circuit board are not precisely co-planar then voids, cracks or other defects can occur in the joints, leading to poor electrical contact. Non-uniformities can result from poor control of land diameters and from inconsistencies in the electroplating masking and deposition steps.

Other process such as forming the solder bumps by evaporation and by moulding solder bumps onto pre-prepared land pads suffer from other disadvantages.

There is therefore a need for an improved mechanism of making electrical contacts between a chip and a circuit board.

According to the present invention there is provided a method of providing connections to a chip having contact pads on the surface thereof, comprising: locating a discrete solder element on each pad; and melting the discrete solder elements so as to cause each of them to adhere to the respective pad, thereby forming a solder bump extending from the surface of the chip; wherein the size of each discrete solder element relative to the area of the pad on which it is located is such that the height of each bump is less than 70% of the diameter of the solder element that formed it.

The size of each discrete solder element relative to the area of the pad on which it is located may be such that the height of the bump is less than 60% of the diameter of the solder element that formed it.

The size of each discrete solder element relative to the area of the pad on which it is located is such that the height of the bumps may be more than 40% of the diameter of the solder element that formed it.

The diameter of each discrete solder element may be less than 80% of the diameter of the pad on which it is located.

The diameter of each discrete solder element may be more than 50% of the diameter of the pad on which it is located.

The volume of each discrete solder element in $\mu m^3$ may be less than 200 times the area of the pad on which it is located in $\mu m^2$.

The volume of each discrete solder element in $\mu m^3$ may be more than 80 times the area of the pad on which it is located in $\mu m^2$.

The pads may be circular.

The solder elements may be spherical.

The method may comprise positioning a stencil on the chip, the stencil being configured to locate the discrete solder elements on the pads; and subsequently performing the said step of locating a discrete solder element on each pad by means of the stencil.

The stencil may define through-holes, the innermost rims of which are configured to locate the discrete solder elements on the pads, and the method may comprise positioning the stencil on the chip such that the innermost rims of the through-holes are spaced from the surface of the chip.

The stencil may include stand-offs for spacing the innermost rims of the through-holes from the surface of the chip when the stencil is positioned on the chip.

The step of melting the discrete solder elements may be performed whilst the stencil remains positioned on the chip.

The method may comprise applying a flux to the pads; and the step of melting the discrete solder elements may be performed after the stencil has been removed from the chip, the discrete solder elements being retained in location on the pads by the flux.

The method may comprise defining a zone at each pad that is preferentially wetted by molten solder so as to confine the solder to the pads when the solder elements are melted.

Figure 2:
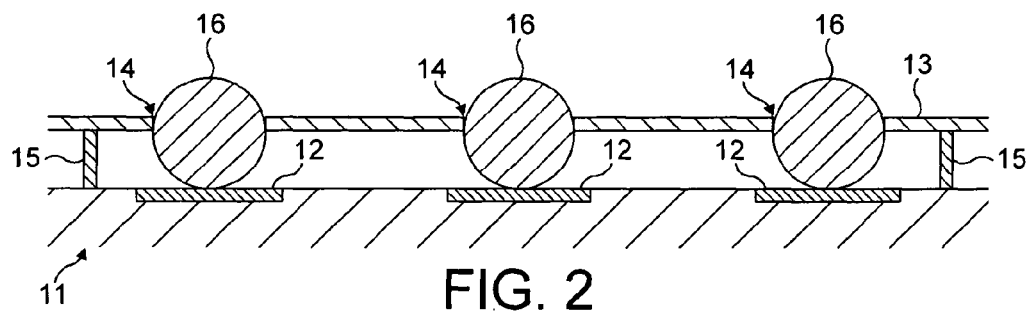

The present invention will now be described by way of example with reference to the accompanying drawings. In the drawings:

FIG. 1 illustrates a chip with solder bumps formed on it;
FIG. 2 illustrates a chip with solder balls applied to it; and
FIG. 3 illustrates a chip with solder bumps formed on it.

Figure 3:
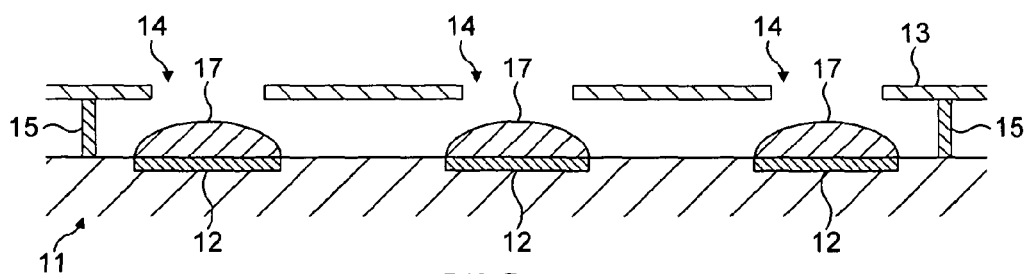

In the process illustrated in FIGS. 2 and 3, solder balls that are substantially smaller than the lands on the chip are melted on to the chip. This results in bumps that are substantially shallower than are normally produced by the solder ball method. Exemplary processes of this type can provide bumps with relatively low stand-off height but yet with good bonding between the bump and the chip, and with flexible choice of solder compositions.

FIG. 2 shows a chip 11. The chip would normally take the form of an integrated circuit device containing one or more signal processing or logic elements but it could be a sensor or other electrical component. The chip has an exterior face on which contact points 12 are defined. The contact points take the form of exposed pads or lands of conductive material such as copper or gold which make contact with elements on or inside the chip. As an example, the chip could be a wireless transceiver chip and the contact points could allow signals to flow into the chip for subsequent transmission by the chip. The chip could be formed of a semiconductor material such as doped silicon, and could be packaged, partially packaged or unpackaged. The chip could be singulated or not; for convenience only part of one chip is shown in FIGS. 2 and 3.

Flux (not shown) is applied to the lands 12 to facilitate the bonding of solder to the lands.

A stencil 13 is then positioned over the chip. The stencil has holes 14 therethrough. The holes are in register with the lands 12 on the chip when the stencil is correctly located relative to the chip.

Then solder balls 16 are positioned in the holes 14 in the stencil. The holes are sized so as to accurately receive the balls, so that when a ball is inserted in a hole there is substantially no lateral play of the ball in the plane of the stencil. The balls can be positioned in the holes by a placement machine. The flux previously applied to the lands helps to hold the solder balls in place, and if that adhesion is sufficiently strong then the stencil could be lifted away at this point in the process. Despite any adhesive action of the flux, it is preferred that the chip remains in an orientation in which the face of the chip that bears the lands is uppermost when the balls have been placed on it but have not yet been melted. Depressions or other physical configurations on or in the lands could be used to locate or hold the balls in place. The flux could be applied to the balls rather than to the pads.

The chip and the balls are then heated, for example by an oven, to cause the solder balls to melt and adhere to the lands. As they melt, the balls spread to cover the lands with solder, leaving a bump 17 of solder upstanding from the land. This situation is illustrated in FIG. 3. Because the balls are substantially smaller than the lands the boundary of each hole 14 in the stencil overlies the corresponding land and the corresponding bump. Because of this, the stencil is equipped with stand-offs or spacers 15. The stand-offs 15 extend from the lower surface of the stencil and space the lower surface of the stencil from the chip when the stencil is in place over the chip. The fact that the stencil is equipped with stand-offs means that when the balls have been melted they do not contact the stencil (as shown in FIG. 3), and the stencil can therefore readily be removed from the chip. As an alternative to stand-offs, the lower parts of the side-walls of the holes 14 could be chamfered so that whilst the balls are still held securely by the upper parts of the holes' walls the lowest part of each hole's wall is outside the periphery of the appropriate land.

The lands 12 can have any suitable size or shape. Preferably the lands are circular but they could have another shape. The lands could have a diameter or largest diameter of for example, 300 or 250 µm, but they could be larger or smaller. When the lands are not circular, the average diameter of a land, or alternatively the diameter of a circular land having the same area as the land in question, could be used to calculate measure A below.

The balls have a substantially smaller cross-sectional size than the lands, with the result that when the balls have melted the height of the bump is relatively low. In one example, the balls could be spherical and have a diameter of 200 µm for circular lands of diameter 300 µm, resulting in a bump height of approximately 100 µm. In another example, the balls could be spherical and have a diameter of 170 µm or less for circular lands of diameter 250 µm, resulting in a bump height of approximately 100 µm. These diameters are substantially smaller than are conventionally used for lands of the respective size. The size of the balls relative to the lands may be gauged by means of any of a number of measures. Examples of such measures are:

measure A: the ball diameter as a percentage of the land diameter;
measure B: the ball volume in $\mu m^3$ as a multiple of the land area in $\mu m^2$;
measure C: the height of the bump once a ball has been melted and flowed over a land as a percentage of the initial diameter of the ball.

If measure A is used, the ball diameter is preferably selected so that measure A is below 80, more preferably below 70. If measure B is used, the ball diameter is preferably selected so that measure B is below 200, more preferably below 150. If measure C is used, the ball diameter is preferably selected so that measure C is below 70, more preferably below 60.

It is preferred that the balls are not too small relative to the lands, since that could result in bumps that provide insufficient stand-off height for reliable connection to a circuit board. The same measures may be used to define preferred minima for the ball diameter. If measure A is used, the ball diameter is preferably selected so that measure A is above 50, more preferably above 60. If measure B is used, the ball diameter is preferably selected so that measure B is above 80, more preferably above 90. If measure C is used, the ball diameter is preferably selected so that measure C is above 40, more preferably above 50.

The land preferably has a diameter or average diameter of 300 µm or less. The ball preferably has a diameter or average diameter of 200 µm or less.

The balls need not be spherical. Spherical balls are preferred because they are relatively easy to fabricate with reliable size by dropping techniques, and can be reliably graded by sieving, but balls of polyhedral or irregular shapes could be used and could be graded by weighing or other methods. When the ball is not spherical the average diameter of the ball, or the diameter of a spherical ball having the same volume as the ball in question, could be used to calculate measures A and C above.

Preferred combinations of ball size and land size may be defined by any combination of the upper and/or lower limits defined above for any one or more of the measures A, B and C.

Once the balls have been formed into bumps adhered to the chip, the stencil is removed from the chip and the chip can be connected to a circuit board by conventional methods such as reflow soldering. If flux or other material on the lands is capable of adhering the balls to the lands, or if other means such as depressions in the lands are provided to inhibit the balls from leaving the lands until the balls have been melted, then the stencil could be removed before the balls are melted or the stencil could even be omitted and the balls positioned using a pick-and-place machine.

The chip is preferably configured so that the solder wets the lands in preference to the material of the chip that surrounds the contact pads. As is well-known, this can be done through selection of the material of the chip and/or the circuit board or of coatings such as flux that can be applied to the pads. Such techniques help to confine the solder to the pads, making the stand-off distance after reflow more predictable.

The present method has a number of advantages over prior art methods. First, in comparison to methods such as plating or printing the use of solder balls allows more freedom in solder compositions, since the balls can be fabricated separately from the chip. Thus the solder composition can be selected to avoid intermetallic compound variation and voids, which directly affect joint reliability in other processes.

Second, solder balls can be obtained with very reliable and narrow size distribution. This means that the bumps resulting from the present method can be expected to be highly co-planar, allowing reliable connection to a circuit board. In comparison, printing and in particular plating processes can be subject to significant process variation.

Third, by using a ball that is significantly smaller than the land, a relatively large bond area between the land and the bump is obtained. This improves the quality of the joint between the land and the bump, and reduces stress at the joint making the chip more resistant to shock when it is attached to a circuit board. Notably, the bond area is significantly greater than would be obtained by simply using smaller balls than are used in current techniques but with correspondingly smaller lands too.

Different bump configurations may be combined on a single chip. Some of the connections to the chip may be formed in the manner described above whilst others are formed by another method. Some of the connections may have bumps of one size and some of the connections may have bumps of another size, provided this is compatible with the substrate on to which the chip is to be mounted. For example, a single chip could have lands of different sizes on which solder balls of the same or different sizes are used to form bumps.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A method of providing connections to a chip having contact pads on the surface thereof, comprising:
    positioning a stencil on the chip, the stencil being configured to locate discrete solder balls on the contact pads;
    locating a discrete solder ball on each pad by placing respective solder balls in said positioned stencil; and
    melting the discrete solder balls so as to cause each of them to adhere to its respective pad, thereby forming a solder bump extending from the surface of the chip;
    wherein the size of each discrete solder ball relative to the area of the pad on which it is located is such that the height of each bump is less than 70% of the diameter of the solder ball that formed it.

2. A method as claimed in claim 1, wherein the size of each discrete solder balls relative to the area of the pad on which it is located is such that the height of the bump is less than 60% of the diameter of the solder ball that formed it.

3. A method as claimed in claim 1, wherein the size of each discrete solder ball relative to the area of the pad on which it is located is such that the height of the bumps is more than 40% of the diameter of the solder ball that formed it.

4. A method as claimed in claim 1, wherein the diameter of each discrete solder ball is less than 80% of the diameter of the pad on which it is located.

5. A method as claimed in claim 1, wherein the diameter of each discrete solder element is more than 50% of the diameter of the pad on which it is located.

6. A method as claimed in claim 1, wherein the volume of each discrete solder ball in $\mu m^3$ is less than 200 times the area of the pad on which it is located in $\mu m^2$.

7. A method as claimed in claim 6, wherein the volume of each discrete solder ball in $\mu m^3$ is more than 50 times of the area of the pad on which it is located in $\mu m^2$.

8. A method as claimed in claim 6, wherein the volume of each discrete solder ball in $\mu m^3$ is more than 60 times of the area of the pad on which it is located in $\mu m^2$.

9. A method as claimed in claim 1, wherein the volume of each discrete solder ball in $\mu m^3$ is more than 80 times of the area of the pad on which it is located in $\mu m^2$.

10. A method as claimed in claim 1, wherein the pads are circular.

11. A method as claimed in claim 1, wherein the solder balls are spherical.

12. A method as claimed in claim 1, wherein the stencil defines through-holes, the innermost rims of which are configured to locate the discrete solder balls on the pads, and the method comprises positioning the stencil on the chip such that the innermost rims of the through-holes are spaced from the surface of the chip.

13. A method as claimed in claim 12, wherein the stencil includes stand-offs for spacing the innermost rims of the through-holes from the surface of the chip when the stencil is positioned on the chip.

14. A method as claimed in claim 1, wherein the step of melting the discrete solder balls is performed whilst the stencil remains positioned on the chip.

15. A method as claimed in claim 1, wherein the method comprises applying a flux to the pads; and the step of melting the discrete solder balls is performed after the stencil has been removed from the chip, the discrete solder balls being retained in location on the pads by the flux.

16. A method as claimed in claim 1, comprising defining a zone at each pad that is preferentially wetted by molten solder so as to confine the solder to the pads when the solder balls are melted.

17. A method as claimed in claim 1, wherein the volume of each discrete solder ball in $\mu m^3$ is more than 50 times of the area of the pad on which it is located in $\mu m^2$.

18. A method as claimed in claim 1, wherein the volume of each discrete solder ball in $\mu m^3$ is more than 60 times of the area of the pad on which it is located in $\mu m^2$.

19. A method of providing connections to a chip having contact pads on the surface thereof, comprising:
    positioning a stencil on the chip, the stencil being configured to locate discrete solder balls on the pads;
    locating a discrete solder ball on each pad by placing respective solder balls in said positioned stencil; and
    melting the discrete solder balls so as to cause them to adhere to their respective pads whilst the stencil remains positioned on the chip, thereby forming a solder bump extending from the surface of the chip,
    wherein the size of each discrete solder ball relative to the area of the pad on which it is located is such that the height of each bump is less than 70% of the diameter of the solder ball that formed it.

20. A method of providing connections to a chip having contact pads on the surface thereof, comprising:
- applying a flux to the pads;
- subsequent to applying a flux to the pads, positioning a stencil on the chip, the stencil being configured to locate the discrete solder balls on the pads;
- locating a discrete solder ball on each pad by placing said solder balls in said positioned stencil such that the discrete solder balls are retained in location on the pads by the applied flux; and
- melting the discrete solder balls so as to cause them to adhere to their respective pads after the stencil has been removed from the chip, thereby forming a solder bump extending from the surface of the chip,
- wherein the size of each discrete solder ball relative to the area of the pad on which it is located is such that the height of each bump is less than 70% of the diameter of the solder ball that formed it.

* * * * *